US009246482B2

(12) United States Patent
Shipley et al.

(10) Patent No.: US 9,246,482 B2
(45) Date of Patent: Jan. 26, 2016

(54) POWER SWITCHES FOR AIRCRAFT

(75) Inventors: Adrian Shipley, Cheltenham (GB);
Martin James Stevens, Cheltenham (GB); Phil Mawby, Coventry (GB);
Angus Bryant, West Midlands (GB)

(73) Assignee: GE AVIATION SYSTEMS LIMITED, Gloucestershire (GB)

( * ) Notice: Subject to any disclaimer, the term of this patent is extended or adjusted under 35 U.S.C. 154(b) by 0 days.

(21) Appl. No.: 13/082,137

(22) Filed: Apr. 7, 2011

(65) Prior Publication Data

US 2012/0175674 A1 Jul. 12, 2012

(30) Foreign Application Priority Data

Apr. 7, 2010 (GB) .................................. 1005779.2

(51) Int. Cl.
*H01L 29/76* (2006.01)
*H01L 29/15* (2006.01)
*H01L 29/66* (2006.01)
*H01L 31/0312* (2006.01)
*H03K 17/082* (2006.01)
*H01L 29/739* (2006.01)

(52) U.S. Cl.
CPC .......... *H03K 17/082* (2013.01); *H01L 29/7395* (2013.01)

(58) Field of Classification Search
None
See application file for complete search history.

(56) References Cited

U.S. PATENT DOCUMENTS

| 5,663,678 | A | 9/1997 | Chang |
| 5,760,448 | A | 6/1998 | Maeda |
| 5,851,857 | A * | 12/1998 | Kelberlau et al. ............. 438/134 |
| 5,891,792 | A | 4/1999 | Shih et al. |
| 6,376,878 | B1 * | 4/2002 | Kocon ................ H01L 29/0634 257/288 |
| 6,627,961 | B1 | 9/2003 | Francis et al. |
| 7,046,488 | B1 | 5/2006 | Hogg |
| 7,651,917 | B2 | 1/2010 | Kaneko |
| 8,193,848 | B2 * | 6/2012 | Zhang et al. ................... 327/318 |

(Continued)

FOREIGN PATENT DOCUMENTS

| CN | 1507656 A | 6/2004 |
| CN | 1947259 A | 4/2007 |

(Continued)

OTHER PUBLICATIONS

European Search Report, dated Oct. 15, 2010.
EP Search Report issued Apr. 16, 2014 in connection with corresponding EP Patent Application No. 11161543.1.

(Continued)

*Primary Examiner* — Mark Tornow
*Assistant Examiner* — Priya Rampersaud
(74) *Attorney, Agent, or Firm* — GE Global Patent Operation; William S. Munnerlyn

(57) ABSTRACT

The present invention relates generally to power switches for aircraft. According to a first aspect, the present invention provides an integrated solid state power switch for fault protection in an aircraft power distribution system. The integrated solid state power switch is formed of semiconductor material that provides a field effect transistor (FET) channel that is operable during normal device operation to provide an operating current flow path and a bipolar transistor channel that is operable during device overload conditions to provide an overload current flow path. A method for manufacturing such an integrated solid state power switch is also described. Various embodiments of the invention provide automatic overload current protection for aircraft systems without the need to use bulky switches or heavy cooling equipment.

15 Claims, 4 Drawing Sheets

(56) References Cited

U.S. PATENT DOCUMENTS

| | | |
|---|---|---|
| 8,227,856 B2 | 7/2012 | Kitajima |
| 8,373,236 B2 | 2/2013 | Hijzen et al. |
| 8,390,069 B2* | 3/2013 | Kusunoki ............... 257/360 |
| 2002/0014665 A1 | 2/2002 | Lee et al. |
| 2003/0197246 A1 | 10/2003 | Ker |
| 2005/0020003 A1 | 1/2005 | Johansson et al. |
| 2005/0242371 A1 | 11/2005 | Khemka et al. |
| 2009/0189228 A1* | 7/2009 | Zhang ............... H01L 29/1095 257/402 |
| 2010/0038707 A1* | 2/2010 | Tokuda et al. ............ 257/328 |
| 2010/0295060 A1* | 11/2010 | Kudou ............... H01L 29/7828 257/77 |
| 2010/0301335 A1* | 12/2010 | Ryu ............... H01L 21/8213 257/49 |
| 2011/0031507 A1* | 2/2011 | Tamaso ............... H01L 21/0485 257/77 |
| 2012/0007104 A1* | 1/2012 | Wada ............... H01L 21/0485 257/77 |
| 2014/0225126 A1* | 8/2014 | Aketa ............... H01L 29/41766 257/77 |
| 2014/0332879 A1* | 11/2014 | Henson ............... H01L 29/7813 257/330 |

FOREIGN PATENT DOCUMENTS

| | | |
|---|---|---|
| CN | 101409285 A | 4/2009 |
| CN | 101467254 A | 6/2009 |
| CN | 101651152 A | 2/2010 |
| EP | 0587212 A2 | 3/1994 |
| EP | 0703664 A2 | 3/1996 |

OTHER PUBLICATIONS

Unofficial English Translation of Chinese Office Action issued in connection with corresponding CN Application No. 201110095569.7 on Jul. 11, 2014.

* cited by examiner

POWER SWITCHES FOR AIRCRAFT

FIELD OF INVENTION

The field of invention relates generally to power switches for aircraft. In particular, the present invention relates to improved power switching devices and methods for aircraft which provide fault protection for aircraft power distribution wiring.

BACKGROUND OF THE INVENTION

Aircraft power distribution systems are safety critical. Hence they need to be protected from over-current conditions that may be caused, for example, by lightning strikes, short circuits, etc., that might otherwise produce high currents that permanently damage or break wiring or other electrical components.

Over-current protection is often provided by using various devices and systems that trip and break a circuit if a detected current ($I_{fault}$) is larger than a maximum operating or rated current ($I_{normal}$) in, for example, an aircraft wiring harness.

Low power electrical power distribution (<4 kW) in aircraft is currently performed by SSPCs (Solid State Power Controllers). SSPCs provide a semiconductor switch, which has good performance and characteristics, including: very fast response, limiting of the fault current to within safe limits; a long multi-operation life span; a flexible construction and control scheme, that is fully controllable for both functions of current limiting and interruption; and low-cost with a minimal maintenance requirement.

However to increase the power switching capability of SSPCs a much larger and heavier solution is required (for reasons discussed briefly below), which is why to date the alternative technology of choice for high power aircraft electrical distribution has been the electro-mechanical contactor.

Conventional technology for SSPCs has been based on metal-oxide-silicon field effect transistors (MOSFETs) because of their low on-state resistance which provides low power dissipation (as heat) during normal operation. However, in aircraft systems these devices must be able to survive in harsh transient conditions, which requires the use of high speed control electronics to allow survivable operation.

Additionally, whilst such MOSFET-based systems have various advantages, they also operate at a relatively high temperature (e.g. the MOSFET junction temperature may typically be ~100° C.). Because of this, there is only a relatively small temperature range (i.e. a window of about 50-60° C.) in which the MOSFET devices need to be turned off in the event of a fault in order to prevent them heating into a temperature range above which silicon stops behaving as a semiconductor (i.e. above about 165° C.).

This narrow temperature switch off range places design limitations on the MOSFET-based system. For example, where $I_{fault} \approx 10.I_{normal}$, a power surge can increase the heat generated in the MOSFET devices by a factor of about 100 since heat generated is proportional to $P_{fault}$ (the power to be dissipated $P_{fault} = I^2_{fault}.R$, where R is the resistance of the MOSFET devices). This heat needs to be effectively dissipated if the MOSFET devices are to remain at a temperature of below about 165° C. so as to be able to function as required.

Therefore conventional systems using MOSFETs are often provided with passive and/or active cooling. For example, forced fluid cooling may be used, as may the provision of one or more heatsink devices. The system may also be formed using many individual MOSFET devices provided in parallel, and/or by using very bulky power devices, in order to provide a large physical amount of semiconductor material that can dissipate any heat generated under fault conditions without provoking a substantial temperature rise in the MOSFETs (essentially by reducing the value of R).

Hence in order to be able to cope with possible over-current conditions, particularly at high power, conventional MOSFET-based power protection systems are generally fairly bulky and heavy. Clearly, this is disadvantageous, particularly in aircraft.

SUMMARY OF THE INVENTION

Various aspects and embodiments of the present invention have thus been devised with a view to addressing the aforementioned problems associated with MOSFET-based power protection systems.

According to a first aspect of the present invention, there is provided an integrated solid state power switch for fault protection in an aircraft power distribution system. The integrated solid state power switch is formed of semiconductor material which provides a field effect transistor (FET) channel that is operable during normal device operation to provide an operating current flow path and a bipolar transistor channel that is operable during device overload conditions to provide an overload current flow path. In various embodiments, substantially all of a trip/overload current is routed through the overload current flow path to provide surge current protection.

According to a second aspect of the present invention, there is provided a method for manufacturing an integrated solid state power switch. The switch may be a switch according to an embodiment of the aforementioned first aspect of the present invention. The method comprises providing a substrate layer, doping the substrate layer to provide at least one MOSFET drain region and at least one IGBT collector region, providing a channel layer over the substrate layer, forming at least one contact in the channel layer, and forming at least one gate contact over the contact(s).

By providing an integrated device with dual FET and bipolar channels, various embodiments of the present invention are able automatically to provide over-current protection by virtue of their inherent device physics, without the need for external sensors or active device control. Additionally, as the inherent device structure may provide separate operating current flow and overload current flow paths in the same integrated device, compact low-weight high current devices can be provided whilst eliminating or substantially reducing the need to provide heavy, expensive, or possibly unreliable, forced or unforced cooling devices.

DETAILED DESCRIPTION OF THE INVENTION

Figure 1:
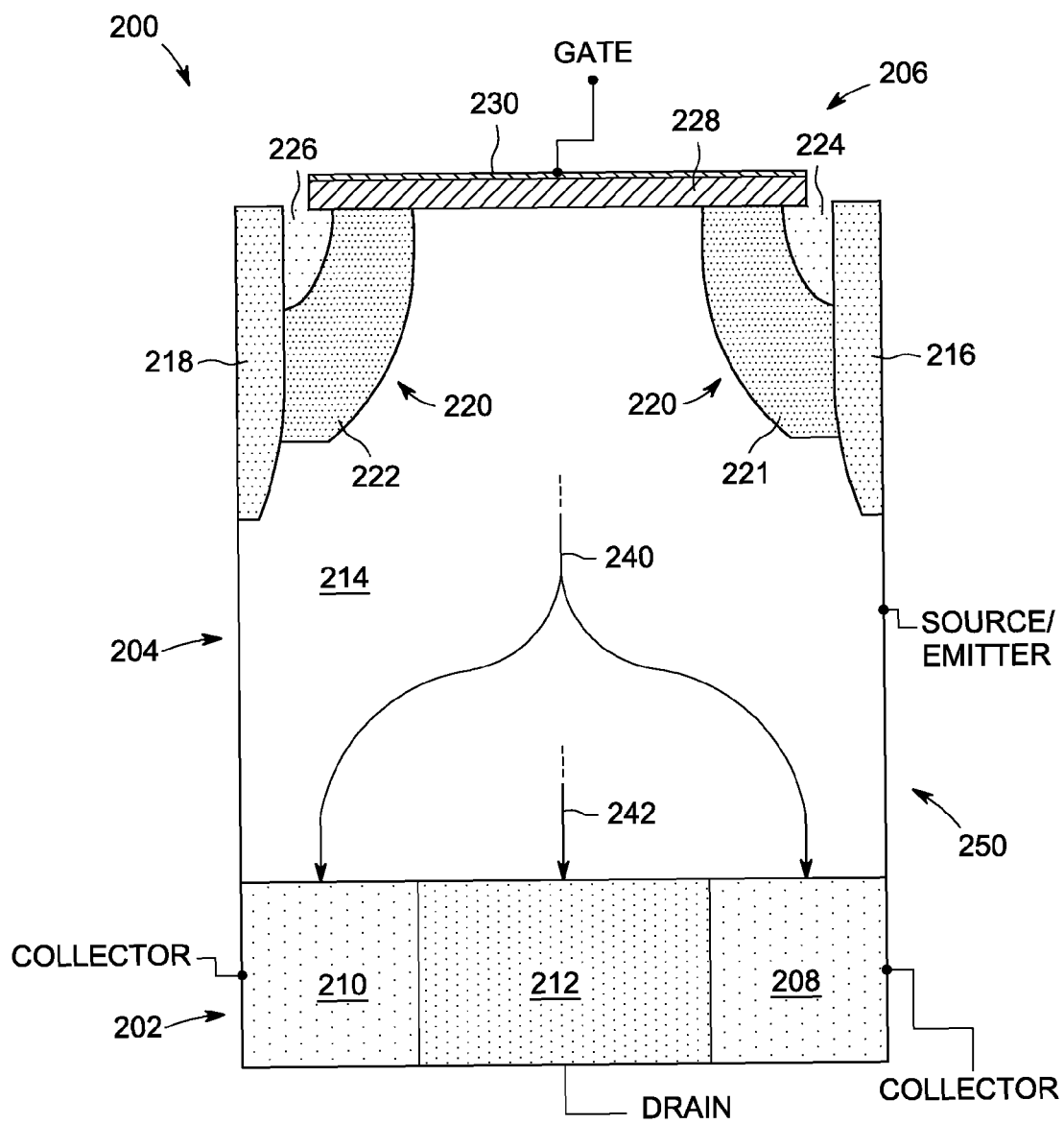
FIG. 1 shows a vertically integrated power switch in accordance with a first embodiment of the present invention.

FIG. 1 shows a vertically integrated power switch 200 in accordance with a first embodiment of the present invention.

The vertically integrated solid state power switch 200 is particularly suited for use in fault protection of aircraft power distribution systems as it is light-weight, compact, reliable and does not require the use of forced cooling to maintain device operational integrity.

The vertically integrated solid state power switch 200 is formed from silicon material 250. Preferably the vertically integrated solid state power switch 200 is made from a single high purity silicon wafer 204. The silicon wafer 204 is doped on one side to provide a central $N^+$-type MOSFET drain region 212. On the same side of the wafer 204, P-type IGBT doped collector regions 208, 210 are provided concentrically surrounding the $N^+$-type MOSFET drain region 212 within a substrate layer 202. The substrate layer 202 is provided with contacts (not shown) and forms a combined drain/collector of the vertically integrated solid state power switch 200.

A channel layer 214 is provided in the silicon wafer 204. The channel layer is doped $N^-$-type and is provided adjacent to the substrate layer 202. The channel layer 214 is electrically connected to the substrate layer 202 and to a source/emitter connection of the vertically integrated solid state power switch 200. In operation, the channel layer 214 provides both an operating current flow path 242 and an overload current flow path 240.

On the opposite face of the wafer 204 from the substrate layer 202, an electrical contact 220 is formed. The contact 220 is generally ring-shaped and concentrically aligned with the centre of the drain region 212. The contact 220 comprises a radially-outermost $N^+$-type ring of material 216, 218 doped into the wafer 204 and exposed at the opposite face of the wafer 204. A radially-innermost concentric P-type ring of material 221, 222 is doped into the wafer 204 and is in contact with the channel layer 214, the opposite face of the wafer 204 and the outermost ring of material 216, 218. A third concentric ring of $N^-$-type material 224, 226 is provided in contact with the opposite face of the wafer 204, the outermost ring of material 216, 218 and the innermost ring of material 221, 222 to complete the structure of the contact 220.

The channel layer 214 extends from the substrate layer 202 to the surface of the opposite face of the wafer 204 through the centre of the innermost ring of material 221, 222. Above this surface-exposed channel layer 214 a disc-shaped layer of oxide material 228 is provided. The oxide material 228 also overlaps the innermost ring of material 221, 222 and part of the third ring of material 224, 226 where they are exposed at the surface of the opposite face of the wafer 204. A metallic layer of material 230 is formed over the oxide material 228 and together these provide a gate contact 206 for the vertically integrated power switch 200.

The design of the vertically integrated power switch 200 is advantageous in that the MOSFET structure and IGBT structure occupy substantially same volume vertically between the substrate layer 202 and the gate contact 206 so that a relatively compact device is provided that requires a minimal amount of wafer space and thus also of semiconductor material. This provides advantages in terms of size, weight and cost.

Figure 2:
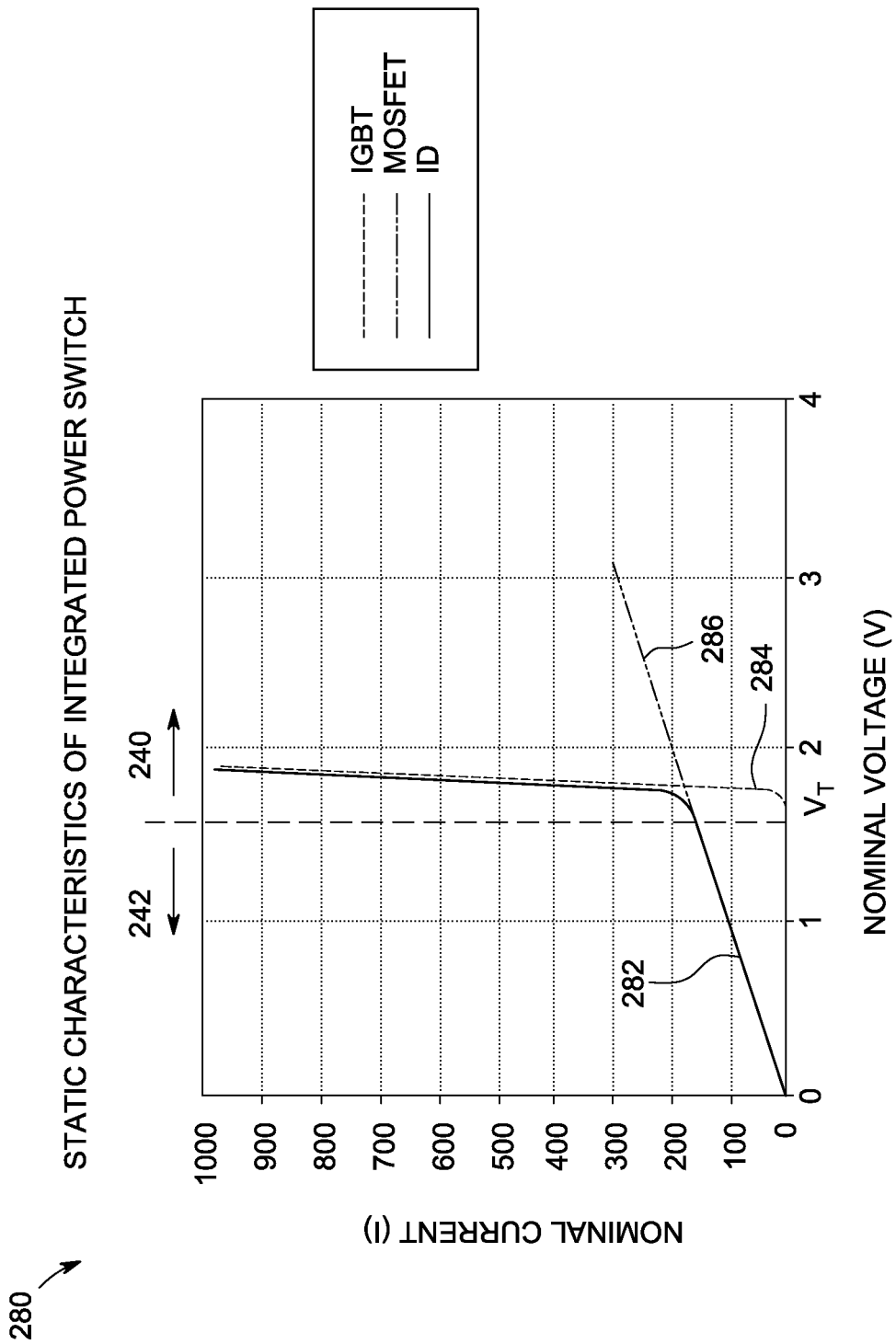
FIG. 2 shows a graph illustrating static V-I characteristics of the integrated power switch of FIG. 1.

FIG. 2 shows a graph 280 illustrating static V-I characteristics of the vertically integrated power switch 200 of FIG. 1. Operation of the vertically integrated power switch 200 will now be described in connection with the graph 280.

During normal device operation, the contact 220, the channel layer 214 and the MOSFET drain region 212 cause the vertically integrated power switch 200 to act as a MOSFET device. A field effect transistor (FET) channel provides an operating current flow path 242 in which current flows from the source/emitter contact to the drain contact and which can be modulated by a voltage applied to the gate contact 206.

As the current I in the channel layer 214 increases, the voltage drop between source/emitter and drain V initially increases linearly whilst the current follows the operating current flow path 242. This is illustrated in FIG. 2 by the initial straight line portion of the integrated device (ID) V-I current profile 282, and shows that the vertically integrated power switch 200 has a substantially constant resistance R at relatively low operating currents. The V-I characteristics of the vertically integrated power switch 200 are thus initially dominated by the FET channel substantially following the MOSFET current profile 286.

As the current I is further increased, the voltage drop V becomes sufficient to cause conduction to begin across a band gap region formed between the P-type collector regions 208, 210 and the $N^-$-type channel material of channel layer 214. This p-n junction region forms a bipolar transistor channel in an IGBT structure formed by the contact 220, the channel layer 214 and the collector regions 208, 210.

As the current I increases even further, the source/emitter-drain/collector voltage drop increases above a threshold value $V_T$ and the IGBT current profile 284 of the bipolar transistor channel begins to dominate the current profile 282, the bipolar transistor channel thereby providing the overload current flow path 240.

In various embodiments, the fault energy dissipated by the integrated power switch is reduced to $E_{fault}$ which is proportional to $P_{fault}=V.I_{fault}$ as compared to $P_{fault}=I^2_{fault}.R$ for a conventional MOSFET device experiencing fault current conditions. This helps reduce the cooling requirements and also means compact devices can be used.

Hence the inherent electrical characteristics of the vertically integrated power switch 200 provide the current profile 282 and thereby enable automatic switching of current from the operating current flow path 242 to the overload current path 240 should the vertically integrated power switch 200 experience current and/or voltage overload conditions.

Figure 3:
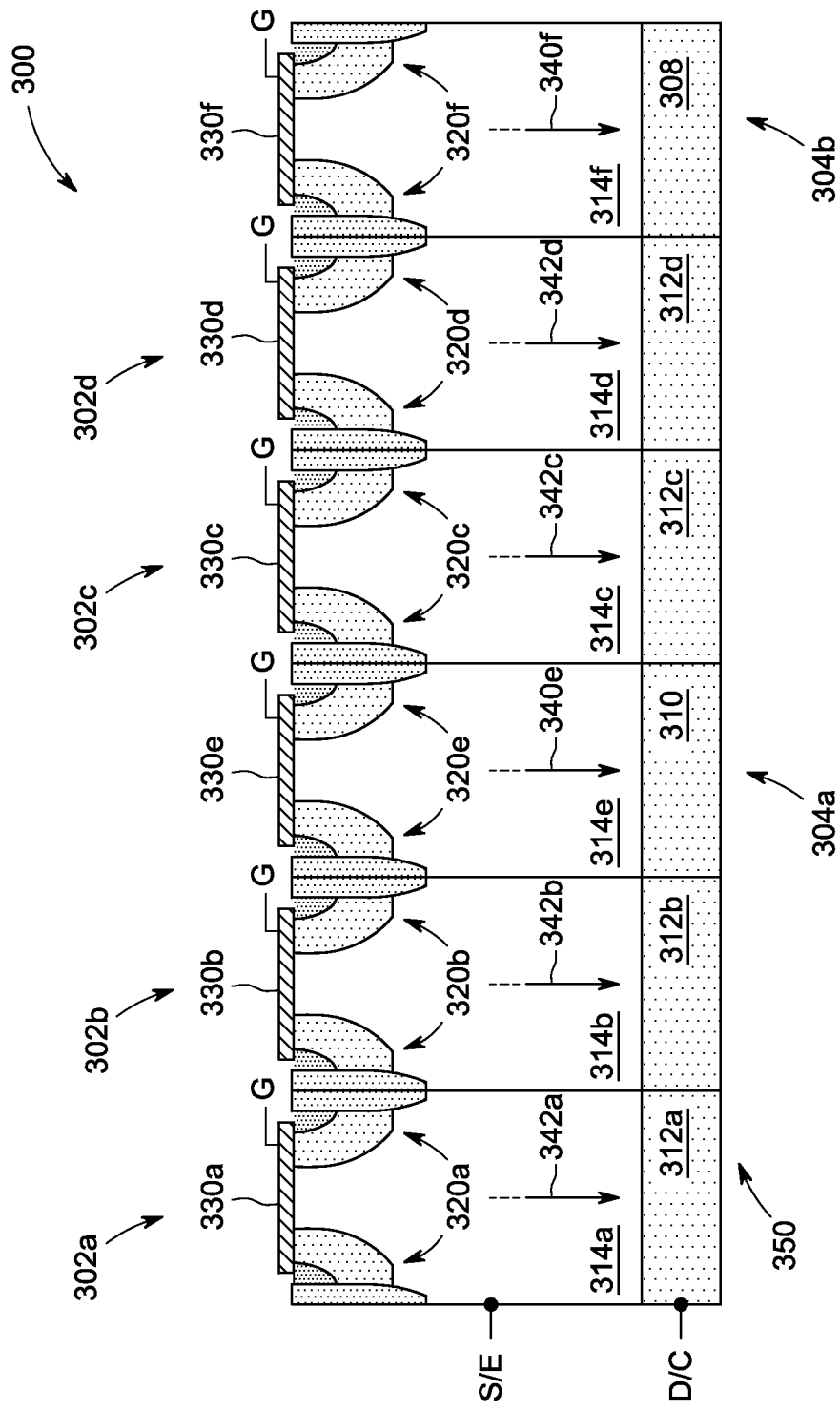
FIG. 3 shows a horizontally integrated power switch in accordance with a second embodiment of the present invention.

FIG. 3 shows a horizontally integrated power switch 300 in accordance with an embodiment of the present invention. The horizontally integrated solid state power switch 300 is formed from silicon material 350. Preferably the horizontally integrated solid state power switch 300 is made from a single high purity silicon wafer, although other materials such as gallium arsenide (GaAs), gallium nitride (GaN), silicon carbide (SiC), etc., may additionally, or alternatively, be used.

The horizontally integrated solid state power switch 300 includes a plurality of adjacently positioned MOSFET devices 302a, 302b, 302c, 302d and a plurality of spaced IGBT devices 304a, 304b. In this embodiment, two adjacent MOSFET devices 302a, 302b, 302c, 302d are provided for every IGBT device 304a, 304b in an alternating regularly spaced pattern with respective pairs of MOSFETs 302a, 302b, 302c, 302d separating the IGBT devices 304a, 304b. Preferably, in various embodiments, a ratio (Δ) of the number MOSFET structures (m) to the number of IGBT structures (1) is greater than 1:1. For example, Δ=m:1, and may be 2:1, 3:1, etc. In one preferred embodiment, the ratio Δ=3:1 as it provides an optimised low value for $R_{drain-source\_on}$ whilst not requiring an excessive number of IGBTs to be provided for overload protection.

The silicon wafer is doped on the side of drain/collector channel contact D/C to provide adjacent first and second $N^+$-type MOSFET drain regions 312a, 312b and third and fourth $N^+$-type MOSFET drain regions 312c, 312d. A first P-type IGBT collector region 310 is doped between the second MOSFET drain region 312b and the third MOSFET drain region 312c. A second P-type IGBT collector region 308 is doped into the silicon wafer material adjacent to the fourth MOSFET drain region 312d.

A channel layer 314 is provided in the silicon wafer over the MOSFET drain regions 312a, 312b, 312c, 312d and the IGBT collector regions 308, 310. The channel layer 314 is doped N-type and is electrically connected to a source/emitter connection S/E of the horizontally integrated solid state power switch 300. In operation, the channel layer 314 provides both an operating current flow path 342 and an overload current flow path 340.

On the opposite face of the wafer from the drain regions 312a, 312b, 312c, 312d, and collector regions 308, 310, electrical contacts 320a, 320b, 320c, 320d, 320e, 320f are formed in each respective MOSFET device 302a, 302b, 302c, 302d and IGBT device 304a, 304b. The contacts 320a, 320b, 320c, 320d, 320e, 320f are generally ring-shaped and concentrically aligned with the centres of the respective drain and collector regions 312a, 312b, 312c, 312d, 308, 310. Each contact 320 is similar in construction to that described above in connection with the contact 220 of the embodiment of FIG. 1, and so will not be further described here.

The channel layer 314 extends to the surface of the opposite face of the wafer through the centre of each of the MOSFET devices 302a, 302b, 302c, 302d and the IGBT devices 304a, 304b. Above this surface-exposed channel layer 314, respective disc-shaped layers of oxide material are provided. Each oxide material layer overlaps a respective contact 320 and is metallised to provide gate contacts 330a, 330b, 330c, 330d, 330e, 330f which can be connected to form a single device gate G.

In normal operation, the MOSFET devices 302a, 302b, 302c, 302d operate in parallel to provide respective current paths 342a, 342b, 342c, 342d that together define the operating current flow path 342. However, for any over-current conditions in excess of the designed threshold current, the action of the parallel connected IGBT devices 304a, 304b becomes dominant providing respective current flow paths 340e, 340f that together define the overload current flow path 340. In various embodiments any overload current flowing through the overload current flow path 340 may be used to provide a signal indicating that an over-current fault has occurred.

The design of the horizontally integrated power switch 300 is advantageous because it enables higher power and fault currents to be handled without the need for forced cooling or heavy passive cooling devices. Additionally, it has inherent built in redundancy such that if any one MOSFET or IGBT device should fail, the horizontally integrated power switch 300 will still be able to operate and provide fault protection.

Figure 4:
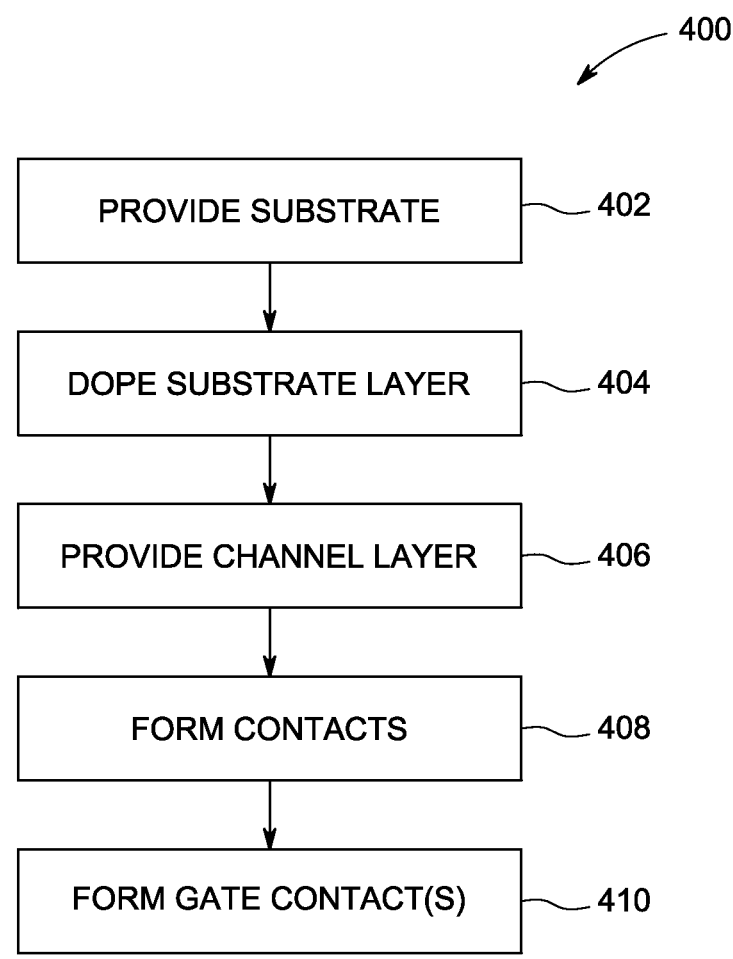
FIG. 4 shows a method of manufacturing various integrated power switches in accordance with embodiments of the present invention.

FIG. 4 shows a method 400 of manufacturing various integrated power switches in accordance with various embodiments of the present invention.

The method 400 comprises the step 402 of providing a substrate layer. The substrate layer is preferably a high-purity silicon wafer. The substrate layer is doped during a doping step 404 to provide at least one MOSFET drain region and at least one IGBT collector region. Various methods may be used for doping, including, for example, one or more of a chemical vapour deposition (CVD) process and a molecular beam epitaxy (MBE) process. Preferably a plurality of N$^+$-type regions are doped into silicon to provide MOSFET drain regions and one or more P-type regions doped into the silicon adjacent to the MOSFET drain regions to provide IGBT collector regions.

Step 406 then includes providing a channel layer over the substrate layer. The channel layer provides both an operating current flow path and an overload current flow path in the integrated power switches. In various embodiments, the channel layer is provided by doping the silicon to be N$^-$-type.

Within the channel layer, during step 408, at least one contact is formed. The contact(s) may be generally ring-shaped and concentrically aligned with respective drain and/or collector regions. Each contact may comprise a radially-outermost N$^+$-type ring of material doped into the wafer, and a radially-innermost concentric P-type ring of material doped into the wafer in contact with the channel layer. A third concentric ring of N$^-$-type material may then be provided in contact with one face of the wafer, the outermost ring of material and the innermost ring of material to complete the structure of the contact.

Over respective contacts, during step 410, at least one gate contact is then formed. The gate contact(s) may be substantially in vertical alignment with respective MOSFET drain regions and an IGBT collector region so as to form a vertically integrated hybrid device. The at least one gate contact may also, or alternatively, include a plurality of gate contacts horizontally offset with respect to one another and substantially in vertical alignment with a respective MOSFET drain region or an IGBT collector region so as to form a horizontally integrated hybrid device.

The channel layer may extend from the substrate layer to a surface of the wafer through the centre of an innermost ring of material. Above this surface-exposed channel layer a disc-shaped layer of oxide material can be provided. The oxide material can be formed to overlap the innermost ring of material and part of the third ring of material where they are exposed at the surface of the wafer. A metallic layer of material may then be formed over the oxide material and together these can then provide one or more gate contacts for the integrated power switch.

Integrated solid state power switches according to various embodiments of the present invention may be high power devices. For example, they may operate at high powers greater than 4 kW. In various embodiments, integrated solid state power switches may be used in secondary power distribution systems for aircraft for distributing power at levels from about 4 kW to about 10 kW. In other applications, integrated solid state power switches may be used in aircraft primary power distribution systems for distributing power at levels greater than about 10 kW (e.g. from about 10 kW to about 20 kW, 50 kW, 100 kW, 250 kW etc.).

Whilst the present invention has been described in accordance with various aspects and preferred embodiments, it is to be understood that the scope of the invention is not considered to be limited solely thereto and that it is the Applicant's intention that all variants and equivalents thereof also fall within the scope of the appended claims.

For example, various embodiments of the present invention may be manufactured having P-type material substituted for N-type material and vice-versa in the illustrated embodiments to form alternative embodiments. In various embodiments, the source/emitter connection may operate as a source and/or an emitter depending upon the operational state of the integrated solid state power switch at any particular time.

Also, whilst the embodiments depicted in the accompanying drawings show separate horizontally and vertically integrated devices, those skilled in the art would be aware that a combination of such devices would be possible, for example, by replacing one or more of the IGBT devices of FIG. 3 with a vertically integrated device of the type depicted in FIG. 1. One or more discrete MOSFET/FET and IGBT/bipolar transistor devices may also be combined to provide alternative embodiments of the present invention.

Those skilled in the art will also be aware that various materials, doping concentrations and designs may be used to tailor the response of various integrated power switches, in accordance with various embodiments of the present invention. For example, devices may be designed such that the operating current flow path has maximal conductivity when the solid state power switch operates with a normal current load having a magnitude $I_{normal}$, and an overload current flow path having maximal conductivity when the solid state power switch operates with a fault current load having a magnitude $I_{fault}$. In various embodiments, the switching state may be set such that $I_{fault} > n \cdot I_{normal}$, where n is an integer having a value greater than one. For example, n>1, with n>>10, or n=10, etc.

What is claimed is:

1. An integrated solid state power switch for fault protection in an aircraft power distribution system, the integrated solid state power switch being formed of semiconductor material comprising:
   a gate structure;
   a single channel layer electrically coupled to the gate structure, wherein the single channel layer comprises:
      a field effect transistor (FET) channel that is operable during normal device operation to provide an operating current flow path; and
      a bipolar transistor channel that is operable during device overload conditions to provide an overload current flow path;
   a substrate layer comprising P-type IGBT doped collector regions surrounding at least one N-type MOSFET drain region wherein the single channel layer is between the gate structure and the at least one-type MOSFET drain region; and
   a source/emitter physically connected to a side of the single channel layer;
   wherein at least one MOSFET structure and at least one IGBT structure occupy substantially the same volume vertically between the substrate layer and the gate structure to form at least one vertically integrated hybrid device.

2. The integrated solid state power switch of claim 1, wherein the operating current flow path has maximal conductivity when the solid state power switch operates with a normal current load having a magnitude $I_{normal}$, and overload current flow path has maximal conductivity when the solid state power switch operates with a fault current load having a magnitude $I_{fault}$.

3. The integrated solid state power switch of claim 2, wherein $I_{fault} > n \cdot I_{normal}$, n being an integer having a value greater than one.

4. The integrated solid state power switch of claim 1, wherein the field effect transistor (FET) channel is provided by at least one metal-oxide-silicon field effect transistor (MOSFET) structure.

5. The integrated solid state power switch of claim 1, wherein the bipolar transistor channel is provided by at least one insulated gate bipolar transistor (IGBT) structure.

6. The integrated solid state power switch of claim 1, wherein the single channel layer is between the gate structure and the P-type IGBT doped collector regions.

7. The integrated solid state power switch of claim 1, wherein a ratio ($\Delta$) of a number MOSFET structures (m) to a number of IGBT structures (i) is greater than 1:1.

8. The integrated solid state power switch of claim 7, wherein the ratio ($\Delta$) is 3:1.

9. The integrated solid state power switch of claim 1, wherein the semiconductor material is silicon.

10. The integrated solid state power switch of claim 1, formed on a single semiconductor wafer.

11. The integrated solid state power switch of claim 1, wherein the integrated solid state power switch is a high power device.

12. The integrated solid state power switch of claim 1, wherein the gate structure comprises a single gate device.

13. The integrated solid state power switch of claim 1, comprising a ring shaped electrical contact formed on a face of the semiconductor material opposite the substrate layer and concentrically aligned with a center of the MOSFET drain region, wherein the contact comprises a radially outermost N+-type ring of material having an exposed surface, a radially innermost concentric P-type ring of material in contact with the channel layer, the outermost ring of material and the face of the semiconductor material opposite the substrate layer, and a third concentric ring of N--type material in contact with the face of the semiconductor material opposite the substrate layer, the outermost ring of material and the innermost ring of material.

14. The integrated solid state power switch of claim 13, wherein the gate structure comprises a layer of oxide material overlapping the innermost ring of material and the third ring of material of the contact where they are exposed at the face of the semiconductor material opposite the substrate layer.

15. The integrated solid state power switch of claim 14, comprising a metallic layer of material over the oxide material to form a gate contact of the gate structure.

* * * * *